United States Patent [19]

Thomas, Jr. et al.

[11] 4,031,479
[45] June 21, 1977

[54] PEAK DETECTING DEMODULATOR

[75] Inventors: Virgil E. Thomas, Jr., China Lake; Donald G. Quist, Ridgecrest, both of Calif.

[73] Assignee: The United States of America as represented by the Secretary of the Navy, Washington, D.C.

[22] Filed: Feb. 23, 1976

[21] Appl. No.: 660,585

[52] U.S. Cl. .............................. 329/50; 307/353; 318/661; 328/151; 329/166
[51] Int. Cl.² ................... G05B 21/02; H03D 1/00
[58] Field of Search .................... 329/50, 110, 166; 328/141, 151, 133, 134; 307/232, 235 C; 318/661

[56] References Cited

UNITED STATES PATENTS

| 3,265,980 | 8/1966 | Thompson | 329/50 X |
| 3,438,026 | 4/1969 | Prill et al. | 318/661 X |
| 3,717,818 | 2/1973 | Herbst | 328/141 |
| 3,793,592 | 2/1974 | Matonak et al. | 329/166 X |

Primary Examiner—Siegfried H. Grimm
Attorney, Agent, or Firm—R. S. Sciascia; Roy Miller; W. Thom Skeer

[57] ABSTRACT

A demodulator wherein the typical low-pass filter is replaced with a sample and hold circuit. By sampling the peak information of the input a-c signal and storing until the next peak sample, an output of extremely low ripple is accomplished.

5 Claims, 3 Drawing Figures

PEAK DETECTING DEMODULATOR

BACKGROUND OF THE INVENTION

The present invention is a peak-detecting demodulator for the conversion of information signals in a.c. format to d.c. voltages representing the information.

In various areas of the field of electronics it is advantageous and sometimes necessary to convert a.c. signals to d.c. voltages. One such area to which the present invention can be applied is the field of stabilization systems. Therein, the source is generally a synchro, resolver, or Rate Integrating Gyro (RIG) pick-off. Taking the resolver as an example, it can be thought of as a rotating transformer whose output varies as a function of shaft angle. The variation ranges from a peak amplitude in-phase with the primary reference excitation to a peak which is 180° out of phase with respect to the reference. The present invention accepts these variable amplitude signals, and with utilization of the reference excitation, provides a d.c. type signal representing the peak amplitude of the a.c. input that will range from a maximum positive peak for input signals in phase with the reference to a maximum negative peak for signals out of phase.

It has always been desirable in stabilization systems to have a "stiff" but wide band loop. Some of the design limitation has been due to the existing demodulator designs for converting a.c. to d.c. signals necessary to drive d.c. torque motors used on the platforms to be stabilized. These demodulators were generally some form of a synchronous full-wave rectifier with a low-pass filter. The low-pass filter was intended to reduce the output ripple to a acceptable level, and was usually a problem area that limited the frequency response of the system.

The present invention overcomes the problems of the above-described, prior systems, and does so in part, by replacing the typical low-pass filter with a sample-and-hold circuit. By sampling the peak information of the input a.c. signal and storing it until the next peak sample, a d.c. output of extremely low ripple is achieved. The response of the present invention allows the output to change amplitude as fast as twice the input frequency (or ½ the period of the input).

Primary advantages of the present invention over prior devices include that samples are taken at the peaks of the signal, and that the reference signal which drives the rectifier and sample trigger is always at some finite value that is large enough to avoid failures in generating trigger or switch commands regardless of how near the input to be processed is to zero, such as is the case when the shaft angle of a resolver is near zero degrees. Also, the present invention provides faster response than does a low pass filter. If the filter is modified to increase its rate of response, ripple also increases, whereas the present invention maintains a low ripple factor by sampling only the peaks of the signal.

DESCRIPTION OF A PREFERRED EMBODIMENT

Figure 1:
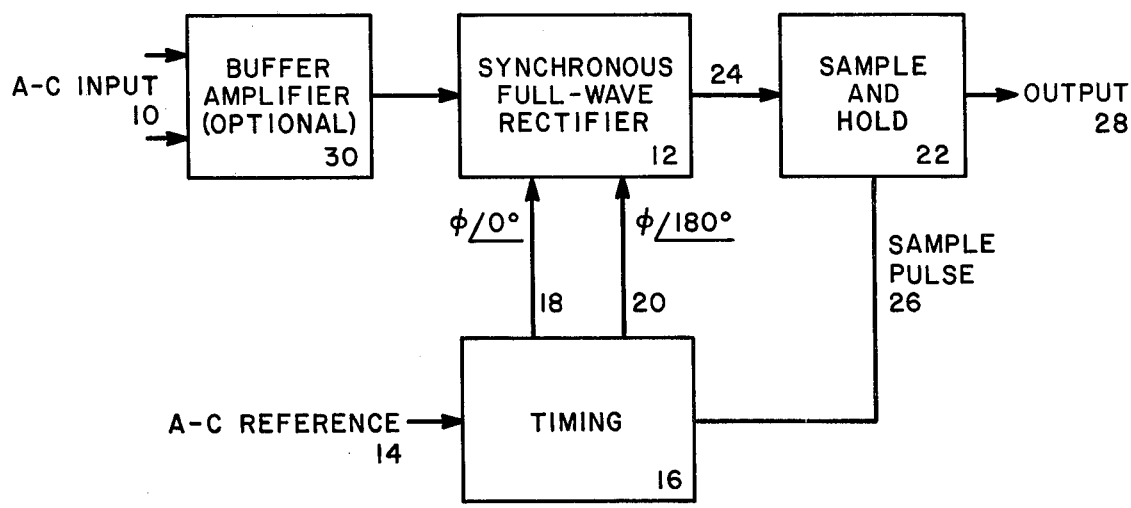
FIG. 1 is a block diagram of a preferred embodiment of the present invention.

FIG. 1 is a preferred embodiment of the present invention in block diagram form, and shows an alternating current (a.c.) input 10 that contains the information that is to be converted by the present invention to direct current (d.c.) form. Input 10 is coupled to synchronous, full-wave rectifier 12 which splits the input into first and second channels of identical signal portions. One channel is coupled to the inverting terminal of an amplifier and the other to the non-inverting terminal. Each channel is selectively and mutually exclusively disabled such that only one portion of the signal, such as the negative portion, is coupled to the inverting terminal, and only the other portion of the signal, such as the positive portion, is coupled to the non-inverting terminal, of the amplifier. This input 10 and reference 14 constitute first and second a.c. signals.

Thereby, output 24 of rectifier 12 is the same as a.c. input 10 with the portions being either all positive or all negative, such as with all negative portions flipped over to positive values or all positive portions flipped over to negative values. That is, output 24 is a series of all positive or all negative pulses. If input 10 is in phase with reference 14 output 24 will be a series of positive pulses, but if input 10 is 180° out-of-phase with reference 14 output 24 will be a series of negative pulses.

Output 24 of rectifier 12 is coupled to sample and hold circuit 22 which maintains the peak value of the last preceeding pulse that was gated through by sample enabling pulse 26. Thus, sample and hold circuit 22 comprises gated sample and hold means. Sample pulse 26 is provided by timing circuit 16 that is responsive to the reference, reference 14. Sample enabling pulse 26 is provided at a time that will convey only the peak portion of the pulses of output 24 to output 28. As a result, output 28 is a d.c. level of low ripple that is highly responsive to variations in input 10.

Buffer amplifier 30 is optional and need not be present if input 10 is closely coupled to rectifier 12. It provides a single-ended output for a differentially received input signal and is generally used to provide higher signal to noise output by common mode rejection, which is especially useful if the source is at a remote location from rectifier 12.

Figure 2:
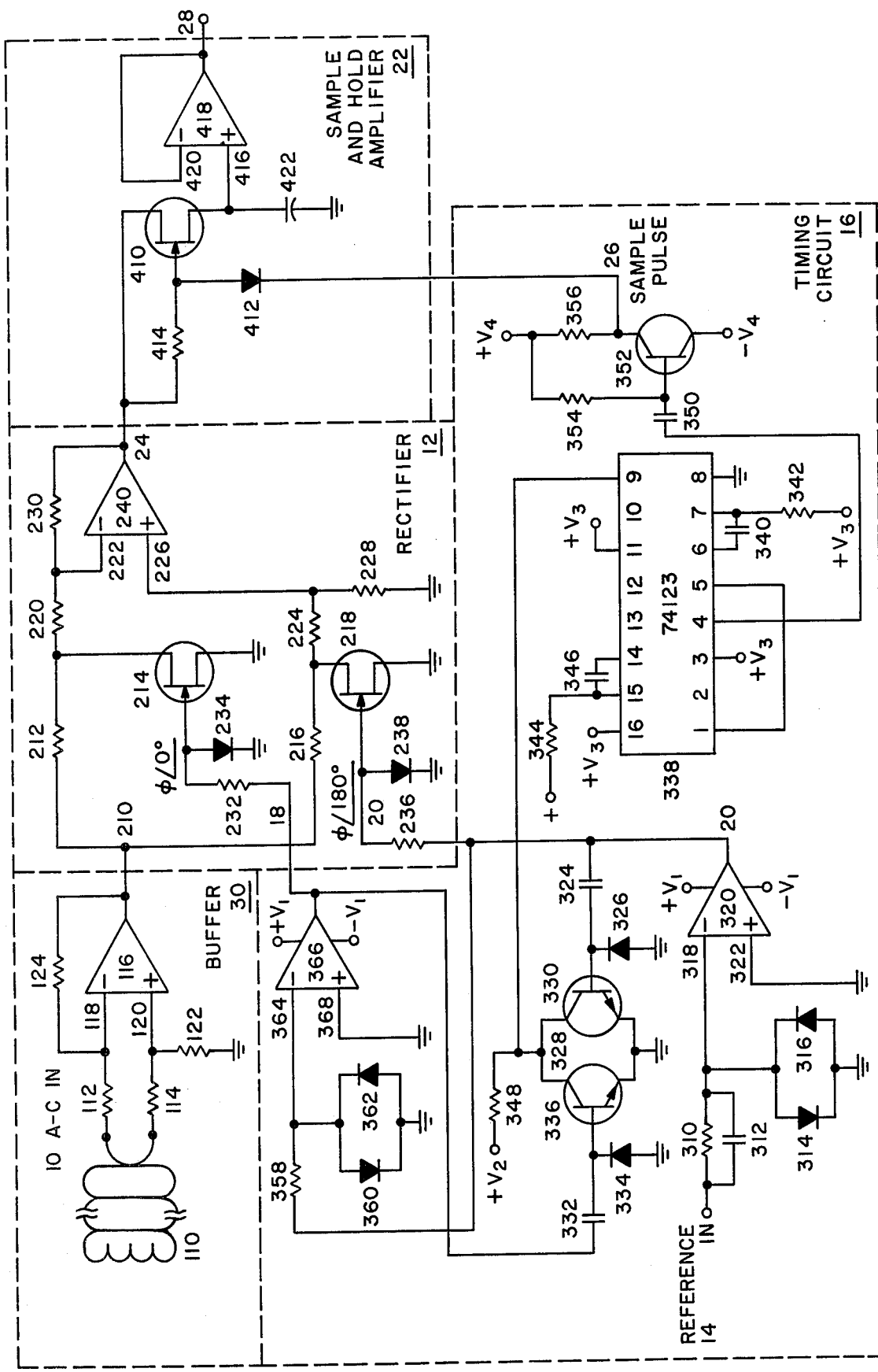
FIG. 2 is a schematic diagram of a preferred embodiment of the present invention.

FIG. 2 is a schematic diagram of the embodiment of FIG. 1. Numerals appearing in FIG. 1 which also appear in FIG. 2 denote like components, parts, or circuits. Alternating current input 10, or the output of buffer 30, if it is used, is coupled to junction 210 of rectifier 12 and split equally into first and second channels the signals of which appear across resistors 212 and 216, respectively.

Transistor 214 is rendered conductive by timing signal 18 which is provided by timing circuit 16 in response to reference signal 14. This disables the channel coupled to inverting terminal 222 causing output 24 to be the signal transmitted by the channel coupled to non-inverting input 226.

Likewise, transistor 218 is rendered conductive by timing signal 20. The signal appearing in the non-inverting channel is thereby dumped by transistor 218.

As a result, if input 10 and reference 14 are in phase the positive swing of input 10 is coupled through the non-inverting channel to input 226 of amplifier 240 and the negative swing is coupled through the inverting channel to input 222. Output 24 is then the upright positive and inverted negative swings, or, in other words, output 24 will be a series of positive pulses. Likewise, if input 10 and reference 14 are 180° out of phase, the positive swings will be coupled through the inverting terminal and the negative swings through the non-inverting terminal to create a series of negative pulses as output 24. The result is that output 24 is input 10, rectified to either a series of positive value pulses or a series of negative value pulses.

The operation of synchronous full-wave rectifier 12 allows it to alternate between non-inverting and inverting amplifier functions. This provides an output of a single polarity determined by the phase relation of the input to the reference. The factors used to determine the resistor values are gain of the stage and input impedance. Since the amplifier is switching between non-inverting or positive to inverting or negative gain, it is critical to match these two gains.

Also, when this stage is used as a single-ended input (without optional input buffer amplifier 30), the input impedance should not be allowed to change when change occurs in the gain. This would possibly cause an input signal change due the variable loading on the source. Therefore, the following equations have been generated to equate positive and negative gains and input resistance in the positive gain mode and in the negative gain mode. When $Q_1(214)$ is "on," or conducting, $Q_2(218)$ is "off," or nonconducting, and vice-versa. These Field Effect Transistors (FET) are controlled by timing circuit 16 to cause the on-off condition to occur in phase with reference signal 14, which in turn is either in phase (zero degree phase shift) or out of phase (180° phase shift with input 10).

For positive gain, $A(+)$, $Q_1$ conducts and $Q_2$ is non-conducting.

$$A(+) = \frac{R_6}{R_4 + R_5 + R_6} \cdot \frac{R_2 + R_3}{R_2}$$

For negative gain, $A(-)$, $Q_2$ conducts and $Q_1$ is non-conducting.

$$A(-) = \frac{R_3}{R_1 + R_2}$$

Gains must be equal; therefore, $$\frac{R_6(R_2 + R_3)}{(R_4 + R_5 + R_6)(R_2)} = \frac{R_3}{R_1 + R_2}$$

The input resistance during positive gain is, $$R_{in}(+) = \frac{R_1(R_4 + R_5 + R_6)}{R_1 + R_4 + R_5 + R_6}$$

The input resistance during negative gain is, $$R_{in}(-) = \frac{R_4(R_1 + R_2)}{R_1 + R_2 + R_4}$$

To keep the input constant, $R_{in}(+) = R_{in}(-)$, $$\frac{R_1(R_4 + R_5 + R_6)}{R_1 + R_4 + R_5 + R_6} = \frac{R_4(R_1 + R_2)}{R_1 + R_2 + R_4}$$

Making a few assumptions will simplify the equations.

Let $R_1 = R_4$ and $R_2 = R_5 + R_6$ which satisfies the constant input resistance requirement.

Let $A = 1$.

Therefore, $A(+) = A(-) = 1$.

$$\frac{R_6(R_2 + R_3)}{(R_4 + R_5 + R_6)(R_2)} = \frac{R_3}{R_1 + R_2} = 1$$

So, $R_3 = R_1 + R_1$.

$$R_6(R_2 + R_3) = R_2(R_4 + R_5 + R_6).$$

From the above assumptions and findings, $$R_6(R_2 + R_1 + R_2) = R_2(R_1 + R_2),$$

or $R_6 = \dfrac{R_2(R_1 + R_2)}{R_1 + 2R_2}$ and $R_5 = R_2 - R_6$,

Where:
$R_1$ is R212,
$R_2$ is R220,
$R_3$ is R230,
$R_4$ is R216,
$R_5$ is R224, and
$R_6$ is R228.

As an example, assigning values to $R_1$ and $R_2$ of 30 kOhms and 13 kOhms, respectively, yields $R_3 =$ 43kOhms, $R_4 =$ 30kOhms, $R_5 =$ 3.018kOhms, and $R_6 =$ 9.982kOhms, A value of R232 and R236 that may be used is 47kOhms, and they are used simply to limit the diode current when their respective FET is in the on state. Diodes 234 and 238 may be type 1N270, and FETs 214 and 218 may be type TIS73.

The purpose of sample-and-hold stage 22 is to sample incoming full-wave rectified a.c. signal 24 at its peak, and store this information until the next peak.

FET 410 provides a low-resistance between input signal 24 and storage capacitor 422 during the sample period. Therefore, the capacitor voltage takes on the peak voltage of the incoming a.c. signal if the sample pulse occurs at the time of peak information. After the sample period, FET 410 turns off, and now has a high impedance condition which prevents C422 from discharging. FET 410 may be type TIS74.

Unity gain amplifier 418 is to buffer the voltage on capacitor 422 and drive a load without discharging the capacitor significantly before the next sample period. The value of capacitor 422 should be chosen to cause the time constant of the output resistance of amplifier 418 plus the resistance of FET 410 when taken with the capacitance of capacitor 422 to arrive at a true value in one sample window. A value that can be chosen is in the order of 0.01 microfarad with a 4 or 5 microsecond sample period.

Timing circuit 16 converts input reference signal 14 into two square waves of proper amplitude. One is at 0° phase shift, and the other at 180° phase shift, with respect to the reference. Each drives one FET of synchronous full wave rectifier 12, and together drive dual one-shot multivibrator 338, which may be a type 74123 integrated circuit as shown, to produce sampling pulse 26 at the peak of incoming information signal 10. Sampling pulse 26 drives FET 410 in sample and hold circuit 22.

Figure 3:
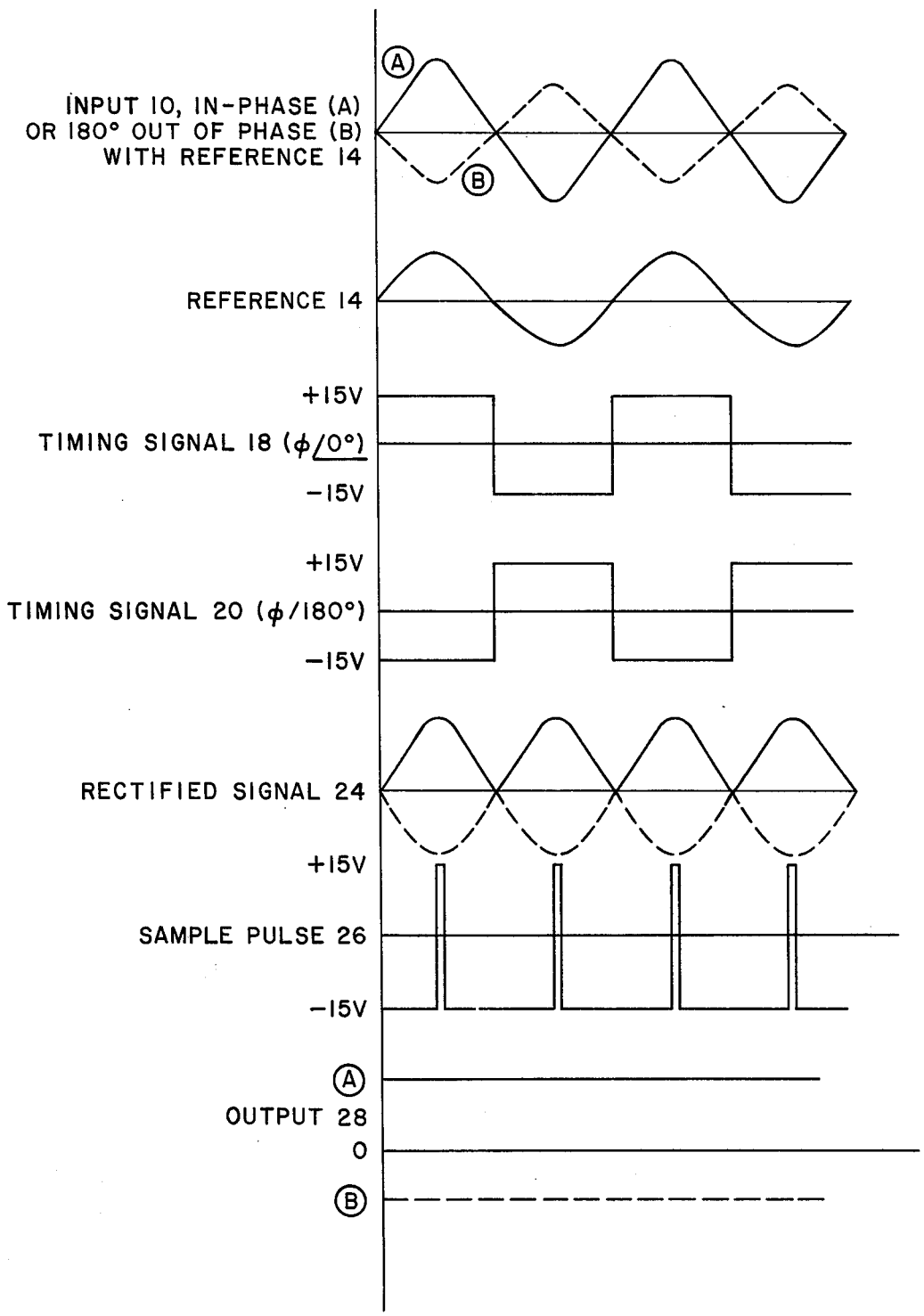
FIG. 3 is a set of representative waveforms present at various points within the preferred embodiment shown by FIGS. 1 and 2.

Operation of the circuit will now be described with reference to the waveforms shown in FIG. 3. Alternating current into junction 210 and reference signal 14 are both a.c. signals of the same frequency and are either in phase, or 180° out of phase. Timing signal 18, generated by timing circuit 16 in response to reference 14, is a square wave in phase with the reference and disables the channel of rectifier 12 associated with FET 214 during the positive swing of the reference. Timing signal 20 is likewise generated by operational amplifier 320 of timing circuit 16 in response to reference 14, and is identical to timing signal 18 except that it is 180° out of phase with the reference. Signal 20 disables FET 218 during the period signal 18 is not diabling FET 214, and vice-versa.

Thereby, the channels alternate in conveying the signals to amplifier 240. As a result, output 24 may be made to have either positive gain or negative gain, depending upon the timing selected.

Timing circuit 16 also provides a sample order pulse 26, to sample-and-hold amplifier 22. Pulse 26 permits amplifier 22 to sample signal 24 for short periods at the signal's peak. The levels sampled are stored and provided at output 28 by amplifier 22, with successive pulses being selectively sampled to update the stored level. Output 28 may be a positive level, or a negative level, depending upon the timing chosen for full-wave rectifier 12.

To those skilled in the art it will be obvious upon a study of this disclosure that the present invention permits a variety of modifications in structure and arrangement and hence can be given embodiments other than those particularly illustrated and described herein, without departing from the essential features of the invention and within the scope of the claims annexed hereto.

What is claimed is:

1. A demodulator for converting varying amplitude alternating current (a.c.) signals into direct current (d.c.) format representative of the information contained therein, comprising:

first and second a.c. signals of identical frequency, wherein said first signal is the input of said demodulator containing said information and said second signal is a reference signal;

rectifying means for full-wave rectifying said input and providing an output of either all positive value pulses or all negative value pulses;

gated means for sampling and holding the value of said pulses when said gated means is gated; and timing means coupled to said reference signal for gating said gated means at only the peak values of said pulses, such that the value held by said gated means is the demodulator's output, which is a d.c. format representative of at least part of the information contained in said a.c. signal.

2. The demodulator of claim 1 wherein said timing means is further for controlling the output values of said rectifying means in response to the phase relationship between said input and reference signals, such that when said signals are in phase said values are positive and when said signals are 180° out of phase said values are negative.

3. The demodulator of claim 2 wherein said rectifying means includes first and second mutually exclusively electrically conductive channels coupled to said input and providing outputs to an amplifier, wherein said first channel is an inverting channel such that when its output is coupled to and through said amplifier the output of said amplifier is inverted in sign from positive values to negative values, or vice-versa, and said second channel is a non-inverting channel.

4. The demodulator of claim 3 wherein said timing means provides first and second signals to said rectifying means, said first signal is associated with said first channel and said second signal is associated with said second channel, and said first channel is disabled when said first signal is coupled thereto and said second channel is disabled when said second signal is coupled thereto, such that said input signal is channelled through either said inverting or said non-inverting channel depending on the phase relationship between said input and said reference signals and the sign of the value of said reference.

5. The demodulator of claim 4 wherein said input signal is said reference signal as modified by a resolver as determined by its shaft angle, such that the demodulator's output is indicative of the shaft angle of said resolver.

* * * * *